United States Patent [19]

Grieco et al.

[11] Patent Number: 4,532,005

[45] Date of Patent: Jul. 30, 1985

[54] DEVICE LITHOGRAPHY USING MULTI-LEVEL RESIST SYSTEMS

[75] Inventors: Michael J. Grieco, Gillette, N.J.; Laura P. Hale, Durham, N.C.

[73] Assignee: AT&T Bell Laboratories, Murray Hill, N.J.

[21] Appl. No.: 612,338

[22] Filed: May 21, 1984

[51] Int. Cl.³ .................. G03C 5/00; B44C 1/22; C03C 15/00; B05D 3/06

[52] U.S. Cl. .................. 156/661.1; 156/643; 156/646; 156/659.1; 427/43.1; 430/312; 430/313; 430/327; 430/330

[58] Field of Search .............. 430/312, 313, 327, 330; 156/659.1, 661.1, 644, 643, 646; 427/43.1

[56] References Cited

U.S. PATENT DOCUMENTS

| | | | |
|---|---|---|---|
| 4,244,799 | 1/1981 | Fraser et al. | 204/192 |
| 4,343,677 | 8/1982 | Kinsbron et al. | 156/643 |
| 4,426,247 | 1/1984 | Tamamura et al. | 156/646 X |
| 4,481,049 | 11/1984 | Reichmanis et al. | 156/646 X |

*Primary Examiner*—William A. Powell
*Attorney, Agent, or Firm*—David I. Caplan

[57] ABSTRACT

In order to hard-bake the bottom resist layer of a tri-level resist system for patterning a device wafer, the resist is subjected to a positive ramp heating step (of increasing ambient temperatures).

11 Claims, No Drawings

DEVICE LITHOGRAPHY USING MULTI-LEVEL RESIST SYSTEMS

FIELD OF THE INVENTION

This invention relates to device lithography and more particularly to the patterning of semiconductor device wafers using multi-level resist systems.

BACKGROUND OF THE INVENTION

Patterning a device wafer is important in a variety of contexts, especially in the art of making semiconductor integrated circuit devices. As known in the art, the various features of a semiconductor integrated circuit device, such as the patterns of the interconnecting metallization lines and of the contact apertures in the insulating layers, must be patterned in accordance with the desired circuit configuration. For such patterning purposes, a tri-level resist system can be used, composed of a relatively thick bottom layer of suitable organic polymer material located upon the top surface of the device wafer to provide a smoothing of any irregularities of the wafer surface, a relatively thin intermediate layer of suitable inorganic material located upon the top surface of the bottom layer, and a top layer of suitable photosensitive resist (photoresist) material located upon the top surface of the intermediate layer. The intermediate layer acts as an etch stop to protect those portions of the bottom layer that are to remain in place for patterning the underlying wafer. For example, the bottom layer of the tri-level resist system is a spun-on organic photoresist layer, typically about 2.0 microns thick or less, of a material taken from a class of novalac-type photoresists such as those designated HPR-204 and HPR-206, manufactured by Phillip A. Hunt Chemical Corporation; the intermediate layer is silicon dioxide which has been plasma deposited to a thickness of about 0.12 micron; and the top layer is an azide-phenolic resin material, about 0.5 micron thick, such as AZ-2415 or MP-1400. A major advantage of this system stems from the fact that the top surface of the tri-level bottom layer is substantially planar even though the top surface of the semiconductor wafer is not, whereby the top surface of the top photoresist layer is likewise substantially planar as is desired for faithful optical imaging and hence for good control over the features in the ultimately patterned device (good linewidth control).

The tri-level resist system typically is used to pattern an underlying device wafer as follows. First, the top photoresist layer is patterned by (1) exposing it to an optical image pattern of light and dark areas, followed by (2) etching the top layer with a chemically selective etch that attacks and removes only the previously exposed light areas. Then, using the thus patterned top layer as a protective mask, the intermediate and bottom layers are patterned by an anisotropic reactive sputter etching step, whereby portions of the surface of the device wafer are exposed. By "anisotropic" it is meant that the patterning results in apertures being formed which have substantially vertical sidewalls in the intermediate and bottom layers. Using the remaining portion of the intermediate and bottom layers as a protective mask, the exposed portions of the surface of the device wafer are patterned as by another anisotropic reactive sputter etching step. Further illustrative details of tri-level resist systems can be found in U.S. Pat. No. 4,343,677 entitled "Method for Patterning Films Using Reactive Ion Etching Thereof," issued to E. Kinsbron et al on Aug. 10, 1982, and U.S. Pat. No. 4,244,799 entitled "Fabrication of Integrated Circuits Utilizing Thick High-Resolution Patterns," issued to D. B. Fraser et al on Jan. 13, 1981.

Prior to forming the intermediate layer upon the bottom layer, it is desirable to hard-bake the bottom layer to planarize (flow), harden and passivate it in order to prevent undesirable outgassing into the intermediate layer (forming pressure-induced cracks therein) and undesirable flow of the resist layer during deposition of the intermediate layer, as well as in order to render the bottom layer more opaque to the optical exposure wavelength, that is, the wavelength of the optical radiation used to form the image pattern in the top layer. Such exposure wavelength is ordinarily in the near ultraviolet region of the optical spectrum, typically in the approximate range of 300 to 400 nanometers; and it is desirable to suppress reflections of such radiation by the top surface of the wafer back into the top photoresist layer where such reflected radiation would otherwise produce undesirable standing waves which spoil the image. Thus, by making the bottom resist layer opaque to the exposure wavelength, the exposure radiation is absorbed therein, whereby production of the undesirable standing waves is prevented. On the other hand, it is also desired that the bottom resist layer be transparent to the wavelength of the optical alignment radiation, normally in the visible region of the spectrum and typically about 600 nanometers, which is subsequently used to align fiducial marks previously made on the top surface of the semiconductor device wafer (and hence also to align the top resist layer) at the proper position for subsequently focusing the optical image pattern in the top resist layer.

In prior art, the bottom resist layer has generally been hard-baked by a heat treatment in an oven chamber, maintained at temperatures of about 200 degrees C. for a time interval of about 2 hours. Such a time interval is unduly long, whereby the processing time is correspondingly undesirably prolonged, and moreover foreign particles in the chamber have an undesirably greater opportunity to contaminate the surface of the resist. Moreover, shortening the heat exposure time (to about 20 minutes) by maintaining the chamber at a higher temperature (about 240 degrees C.) tends to be impractical since it results in a subsequently deposited intermediate layer of silicon dioxide that suffers from an undesirable optical haze (not transparent) and an undesirably rough top surface (dimples and ridges).

SUMMARY OF THE INVENTION

We have discovered that the benefits desired for the hard baking can be achieved in a shortened time without the undesirable effects if there is employed a particular ramp heating cycle for the baking process. In particular, the wafer including a novalac-type resist is passed through successive zones of an oven maintained advantageously at about 180 degrees C., 225 degrees C., and 250 degrees C. for a total bake time of between 6 and 10 minutes, although some variations of these temperatures are feasible as is discussed in more detail below. In this way, the organic resist is passivated to prevent outgassing from or flow of the resist during subsequent deposition of an inorganic layer, such as silicon dioxide, upon the organic resist layer. At the same time, the deposited silicon dioxide layer does not suffer from optical haze or surface roughness, and the organic resist is desirably rendered opaque to the exposure wavelengths in the near ultraviolet while desirable remaining transparent to the alignment wavelength in the visible. Thus, the organic resist can be hard-baked for use in multi-level resist systems for patterning the underlying device without undesirably prolonging the processing time.

DETAILED DESCRIPTION

A semiconductor device wafer to be patterned in accordance with the invention has a topmost surface formed by the top surface of a covering layer(s)—metal, semiconductor, or insulator—to be patterned. This topmost surface can be planar or nonplanar. In either case, upon the topmost surface an organic resist layer is spun-on, whereby the top surface of this resist layer is either substantially planar or can be planarized, if desired, as by known plasma planarization techniques. The resist layer is essentially HPR-206 having a thickness of typically about 2.0 micron or less. The structure (wafer plus resist layer) is introduced into a belt-driven bottom-heated oven system, such as the "wafertrac" system made by GCA Corporation. The oven itself is configured into three successive zones maintained at the three respective temperatures of about 180 degrees C., 225 degrees C., and 250 degrees C. The structure thus passes successively through the three zones, from cooler to successively hotter ambient temperatures at a uniform speed (of the "wafertrac") for a total (bake) time duration of about 6 or 10 minutes. Thus, the structure is subjected to a ramp heating, the ramp going from lower to higher temperatures, from an initial zone (180 degrees C.) through an intermediate zone (225 degrees C.) to a final zone (250 degrees C.). Thus, the temperature of the resist layer gradually increases in a ramp-type profile as a function of time in the oven.

Thereafter, an intermediate layer of silicon dioxide is plasma deposited, followed by a top layer of photoresist, whereby a tri-level resist system is formed. Alternatively, the intermediate layer is spun-on as a polymer, such as polysiloxane, which is densified by a heat treatment to become a silicon dioxide layer. Then the tri-level system can be used for patterning the wafer device by photolithographic patterning of photoresist followed by anisotropically etching the intermediate and bottom layers of the tri-level system, as by reactive sputtering using the patterned photoresist layer as a protective mask, and then anisotropically etching the underlying covering layer, as by reactive sputtering using the intermediate and/or bottom layers of the tri-level system as a protective mask. Thereby the covering layer (of metal, semiconductor, or insulator) is patterned faithfully in accordance with the same pattern as that originally imparted to the top photoresist layer by the photolithographic patterning thereof.

Although the ramp heating of this invention has thus been successfully tested specifically with the organic resists HPR-204 and HPR-206, based upon this experience it is expected that similar ramp heating will likewise operate successfully with other novalac-type resists, such as AZ-1350, AZ-1375, MP-1470, and polychrome. Also, while the use of three different elevated temperature zones is preferred, the temperature of two of them can be the same. Alternatively, the intermediate zone can be eliminated entirely, so that the ramp heating consists of a single ramp going directly from an initial to a final zone.

Although the invention has been described in detail in terms of a specific embodiment, various modifications can be made without departing from the scope of the invention. For example, instead of using a ramp heating of ambient temperatures increasing from an initial temperature of about 180 degrees C. to a final temperature of about 250 degrees C., the temperatures can increase from an initial temperature in the range of about 150 to 180 degrees C. and can end at a final temperature in the range of about 230 to 270 degrees C., and the ramp heating time can be in the range of about 5 to 30 minutes, depending upon the details of the ramp heating temperature as a function of time. Advantageously, the structure including the bottom resist layer is thus subjected for at least about one-quarter of the ramp heating time to ambient temperatures between about 150 degrees C. and 180 degrees C. Also, instead of a tri-level system, a bi-level system may be used for patterning the device wafer in cases where the intermediate layer is not required for the etching process used for patterning the device wafer, as known in the art. Finally, instead of achieving ramp heating by moving the device wafer from cooler to hotter regions of the oven, the device wafer can be kept in a single region whose temperature is varied with time from the cooler to the hotter value.

What is claimed is:

1. In a process for patterning a device wafer using a multi-level resist system having a bottom layer of novalac-type resist, the step of ramp heating the bottom resist layer for a time duration of between about 5 minutes and about 30 minutes, comprising subjecting the bottom resist layer to an initial ambient temperature of between about 150 degrees C. and about 180 degrees C. and thereafter to a final ambient temperature of between about 230 degrees C. and about 270 degrees C., whereby the bottom resist layer is subjected to ambient temperatures between about 150 degrees C. and about 180 degrees C. for at least one-quarter of the time duration.

2. The process of claim 1 in which a silicon dioxide layer is deposited upon the bottom resist layer subsequent to the ramp heating.

3. The process of claim 2 in which the initial ambient temperature is about 180 degrees C., the final ambient temperature is about 250 degrees C., and the time duration is about 6 to 10 minutes.

4. The process of claim 3 in which the resist layer is subjected to an intermediate ambient temperature of about 225 degrees C. after having been subjected to the initial, and before being subjected to the final, ambient temperature.

5. The process of claim 3 in which the ramp heating is achieved by moving the device wafer from an ambient maintained at the initial temperature to another ambient maintained at the final temperature.

6. The process of claim 5 in which a silicon dioxide layer is deposited upon the bottom resist layer subsequent to the ramp heating.

7. The process of claim 3 in which a silicon dioxide layer is deposited upon the bottom resist layer subsequent to the ramp heating.

8. The process of claim 2 in which a silicon dioxide layer is deposited upon the bottom resist layer subsequent to the ramp heating.

9. The process of claim 1 in which the ramp heating comprises successively the initial ambient temperature of about 180 degrees C., an intermediate ambient temperature of about 225 degrees C., and the final ambient temperature of about 250 degrees C.

10. The process of claim 9 in which a silicon dioxide layer is deposited upon the bottom resist layer subsequent to the ramp heating.

11. The process of claim 10 in which the time duration of the ramp heating is in the range of about 6 to 10 minutes.

* * * * *